United States Patent
Lin et al.

(10) Patent No.: US 6,227,869 B1
(45) Date of Patent: May 8, 2001

(54) TERMINAL FOR AN LGA SOCKET

(75) Inventors: Nick Lin, Hsin-Chuang; Chieh-Rung Huang, Tao-Yuan; Yi-Feng Lo, Hsin-Chu, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/335,797

(22) Filed: Jun. 17, 1999

(30) Foreign Application Priority Data

Nov. 24, 1998 (TW) .................................. 87219526

(51) Int. Cl.$^7$ ...................................... H05K 1/00
(52) U.S. Cl. .............................. 439/66; 439/515
(58) Field of Search ................. 439/66, 515, 71, 439/81, 91, 733.1, 591, 608

(56) References Cited

U.S. PATENT DOCUMENTS

| | | | |
|---|---|---|---|
| 4,655,519 | * 4/1987 | Evans et al. | 439/66 |
| 4,906,194 | * 3/1990 | Grabbe | 439/66 |
| 5,308,252 | * 5/1994 | Mroczkowski | 439/66 |
| 5,653,598 | * 8/1997 | Grabbe | 439/66 |
| 5,655,913 | * 8/1997 | Castaneda et al. | 439/66 |
| 5,746,607 | * 5/1998 | Bricaud et al. | 439/66 |
| 5,957,703 | * 9/1999 | Arai et al. | 439/66 |
| 5,984,693 | * 11/1999 | McHugh et al. | 439/66 |

* cited by examiner

*Primary Examiner*—Neil Abrams
*Assistant Examiner*—J. F. Duverne
(74) *Attorney, Agent, or Firm*—Wei Te Chung

(57) ABSTRACT

An LGA socket comprises an insulative housing defining a number of passageways therethrough and a corresponding number of terminals retained therein. Each terminal forms upper and lower spring arms partially extending beyond the corresponding passageway, a curved linking portion for connecting the upper and lower arms, and a securing arm extending from the lower arm towards the upper arm and secured to the insulative housing. The upper arm can be deformed to contact the securing arm thereby providing a short electrical path therethrough and reducing the overall height of the LGA socket.

7 Claims, 6 Drawing Sheets

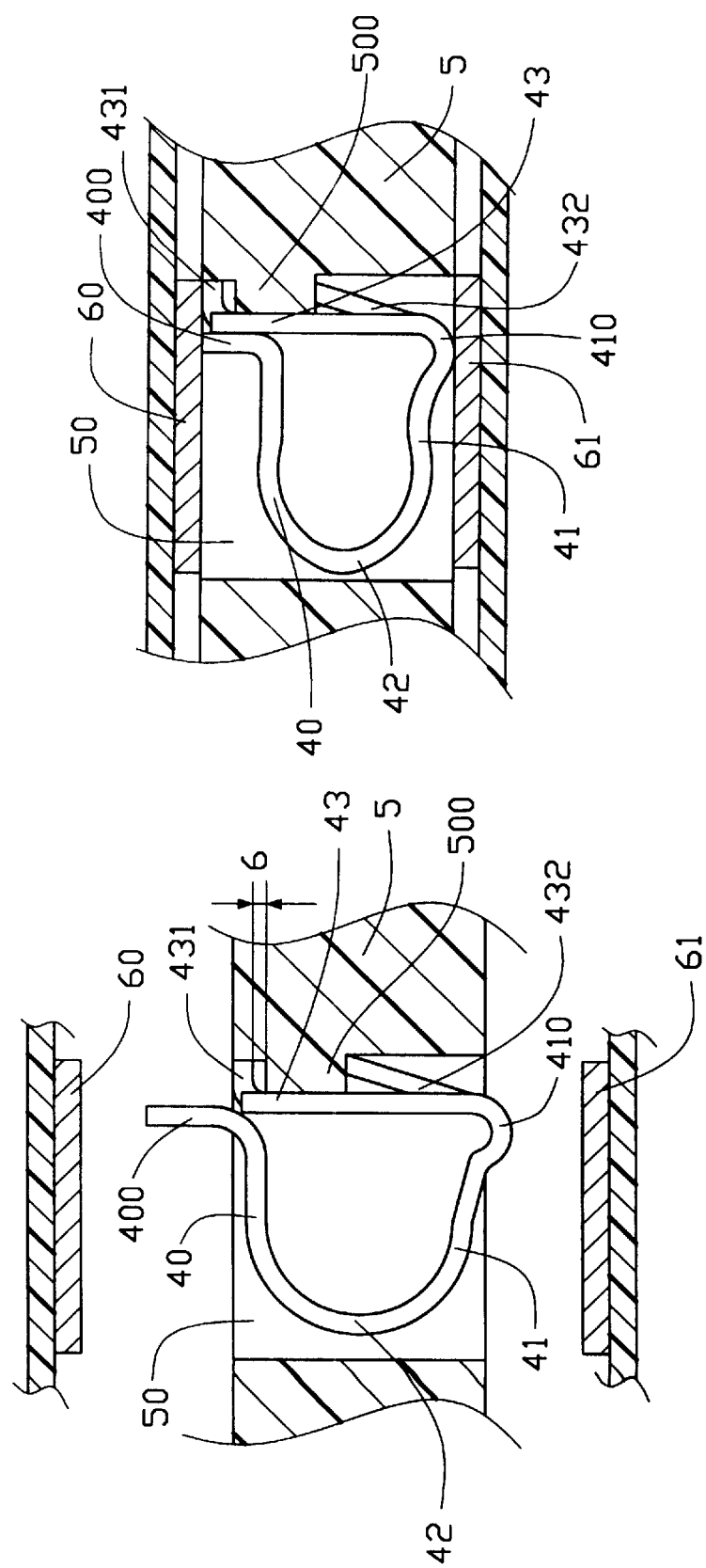

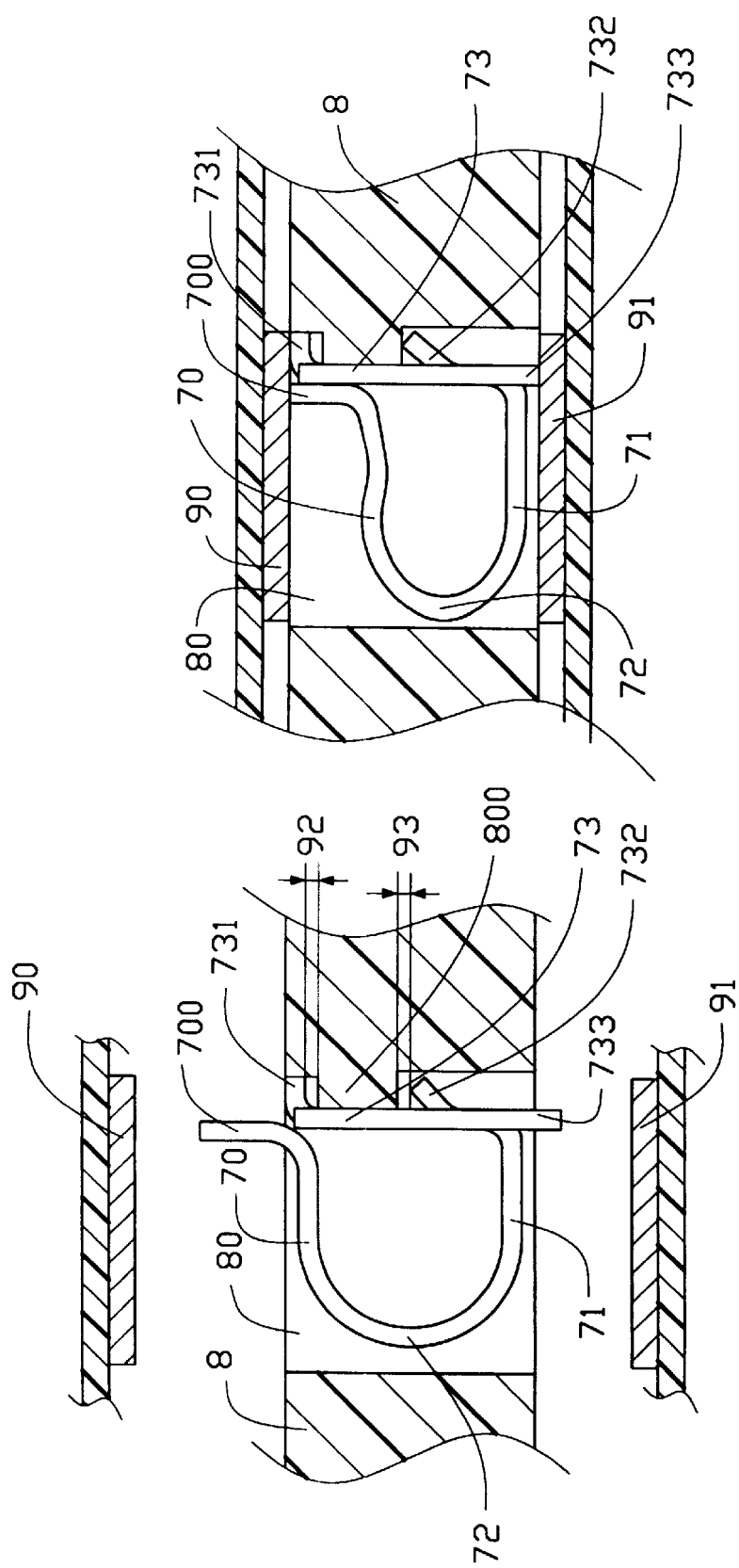

TERMINAL FOR AN LGA SOCKET

BACKGROUND OF THE INVENTION

The present invention relates to an LGA socket, and particularly to a low profile LGA socket for reliably connecting a first printed circuit board and a second printed circuit board.

Personal computers, especially notebook computers, become increasingly compact and multifunctional. The components assembled therein, such as terminals for connecting a first circuit board and a second circuit board must be reliable and have a reduced dimension. U.S. Pat. Nos. 5,308,252 and 5,653,598 disclose pertinent terminal configurations. Each conventional terminal is received in a socket and has two spring arms projecting beyond an insulative housing of the socket for contacting corresponding portions of a first circuit board and a second circuit board, respectively. However, the terminals are retained at only one point of the socket and lack an adjustable height. Thus, the terminal is unreliable and susceptible to mechanical forces which may adversely affect signal transmission through the socket.

SUMMARY OF THE INVENTION

Accordingly, a first object of the present invention is to provide an LGA socket having terminals which each have a short electrical path thereby reducing self-inductance effects.

A second object of the present invention is to provide an LGA socket having a limited height.

A third object of the present invention is to provide an LGA socket which has a plurality of terminals reliably retained therein.

A fourth object of the present invention is to provide an LGA socket including a plurality of terminals having an adjustable height.

To fully accomplish the above-mentioned objects, an LGA socket of the present invention comprises an insulative housing defining a plurality of passageways therethrough and a corresponding number of terminals retained therein. Each terminal forms upper and lower spring arms partially extending beyond the corresponding passageway, a curved linking portion for connecting the upper and lower arms, and a securing arm extending upward from the lower arm towards the upper arm. Retaining means is formed on the securing arm for securing the terminal in the corresponding passageway. The retaining means comprises locking barbs formed on at least one side of the securing arm. In assembly, the upper and lower arms engage electrical pads formed on a first circuit board and a second circuit board, respectively. The upper arm is then deformed to contact the securing arm thereby providing a short electrical path therethrough for reducing self-inductance effects. Alternatively, the retaining means is a combination of a first projection extending from a recess of the securing arm and a second projection stamped from the securing arm. The first and second projections are adapted to abut against a protrusion projecting from an inner side of the passageway.

BRIEF DESCRIPTION OF THE DRAWINGS

FIG. 5 is a cross sectional view of an LGA socket before contacting a first circuit board and a second circuit board;

FIG. 6 is an assembled view of FIG. 5;

FIG. 8 is a cross sectional view of an LGA socket before contacting a first circuit board and a second circuit board; and FIG. 9 is an assembled view of FIG. 8.

DETAILED DESCRIPTION OF THE INVENTION

Figure 1:
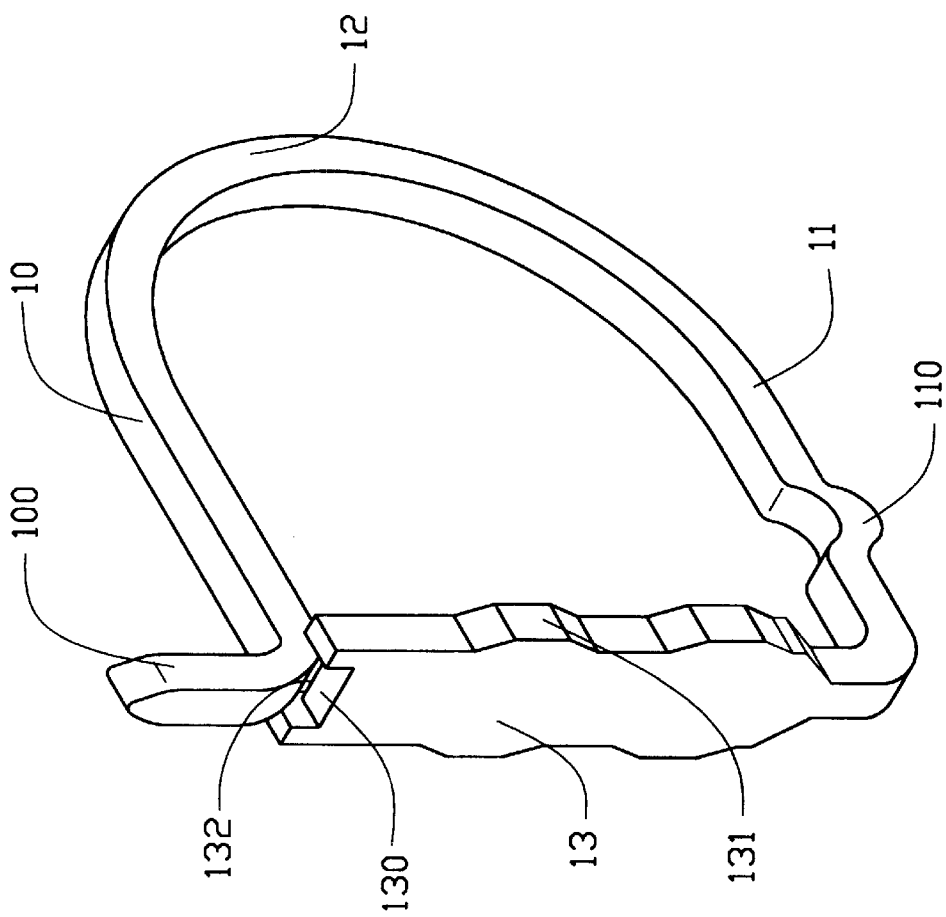
FIG. 1 is a perspective view of a terminal in accordance with a first embodiment of the present invention.
Figure 2:
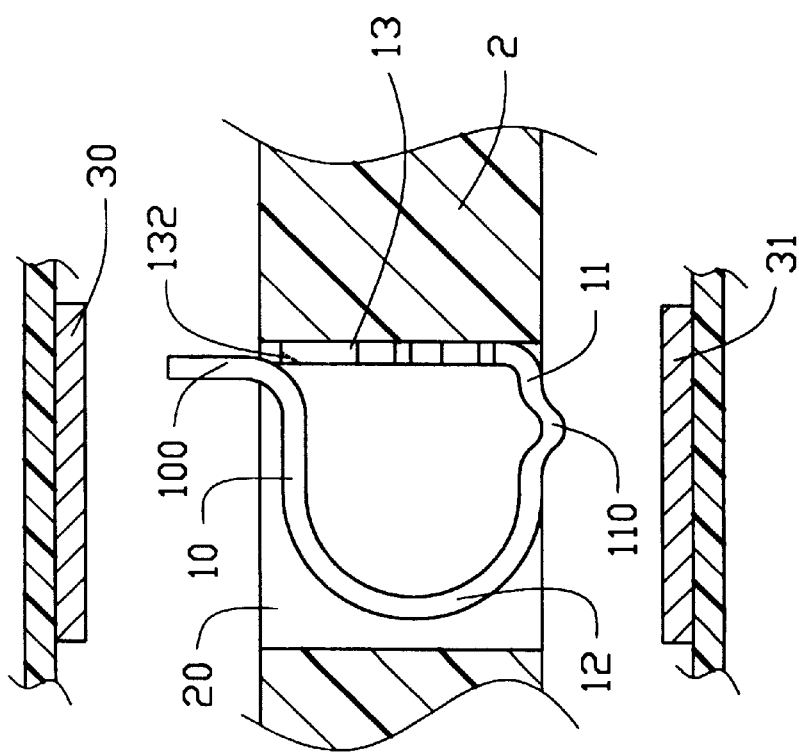
FIG. 2 is a cross sectional view of an LGA socket before contacting a first circuit board and a second circuit board.

Referring to FIGS. 1 and 2, an LGA socket includes an insulative housing 2 defining a plurality of passageways 20 therethrough and a corresponding number of D-shaped terminals 1 retained therein. Each terminal 1 forms upper and lower spring arms 10, 11 which partially extend beyond the corresponding passageway 20. The upper and lower arms 10, 11 are connected by a curved linking portion 12. A securing arm 13 extends upward from an end of the lower arm 11 towards the upper arm 10.

The upper arm 10 has a curved end 100 projecting up and extending beyond the passageway 20. Correspondingly, the lower arm 11 has a curved portion 110 opposite the curved end 100. The securing arm 13 forms a recess 130 at an end thereof and retaining means for securing the terminal 1 in the passageway 20. A slanted leading edge 132 is formed in the recess 130 of the securing arm 13 for guiding a downward movement of the upper arm 10. The retaining means comprises locking barbs 131 formed on both sides of the securing arm 13.

Figure 3:
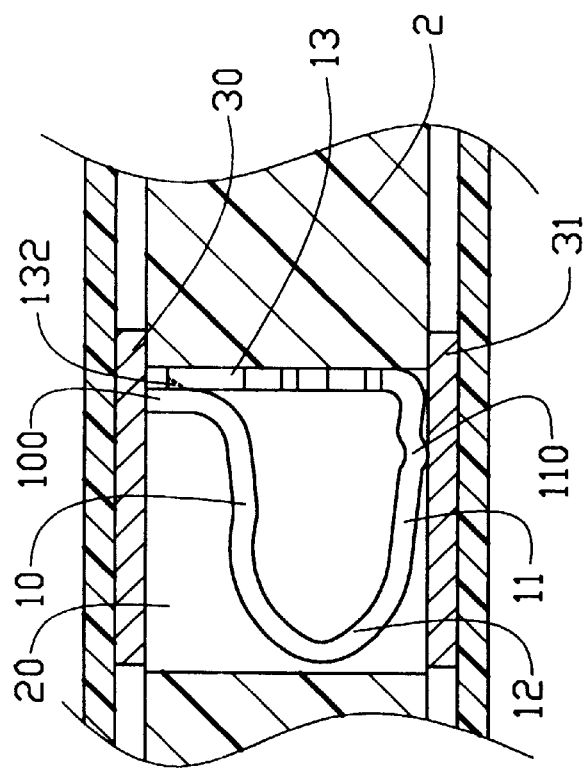
FIG. 3 is an assembled view of FIG. 2.

Referring to FIG. 3, the LGA socket is mounted on a second circuit board. The curved portion 110 of the terminal abuts against an electrical pad 31 of the second board. When the socket engages with a first circuit board, the curved end 100 of the terminal 1 abuts against an electrical pad 30 of the first board. The upper arm 10 of the terminal 1 is then deformed to contact the securing arm 13 thereby providing a short electrical path therethrough and reducing the overall height of the LGA socket. Such a short electrical path can effectively reduce self-inductance effects. In addition, the linking portion 12 is distant from an opposing side of the passageway 20 which provides the connecting portion 12 with clearance for movement.

Figure 4:
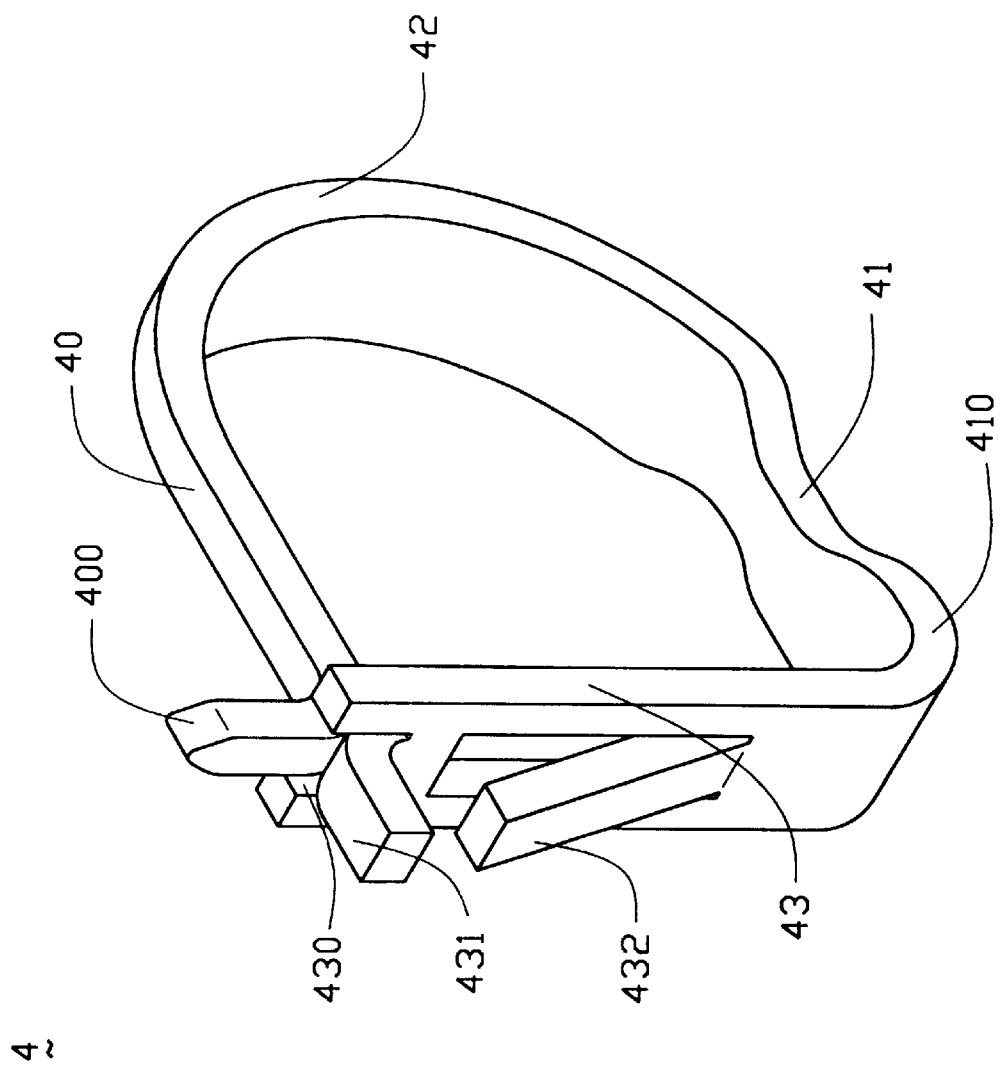
FIG. 4 is a perspective view of a terminal in accordance with a second embodiment of the present invention.

Referring to FIGS. 4 and 5, an LGA socket in accordance with a second embodiment of the present invention includes an insulative housing 5 defining a plurality of passageways 50 therethrough and a corresponding number of terminals 4 retained therein. Each terminal 4 is basically similar to the terminal 1 of the first embodiment and has an upper spring arm 40 forming a curved end 400, a lower spring arm 41 having a curved portion 410, a linking portion 42, and a securing arm 43 with recess 430 defined therein. Retaining means formed on the securing arm 43 is a first projection 431 extending from the recess 430 and a second projection 432 stamped from the securing arm. The first and second projections 431, 432 are adapted to abut against a protrusion 500 projecting from an inner side of the passageway 50. A gap 6 is provided between the first projection 431 and the protrusion 500 such that the terminal 4 can be moveable in the passageway 50 in a vertical direction. In addition, both sides of the securing arm 43 are engaged with inner sides of the passageway 50 for retaining the terminal 4 in the passageway 50.

Referring to FIG. 6, the LGA socket is mounted on a second circuit board. The curved portion 410 of the lower arm 41 abuts against an electrical pad 61 of the second board. When the socket engages with a first circuit board, the curved end 400 abuts against an electrical pad 60 of the board. The upper arm 40 of the terminal 4 is then deformed to contact the securing arm 43 thereby providing a short electrical path therethrough and reducing the overall height of the LGA socket. Such a short electrical path can effectively reduce self-inductance effects.

Figure 7:
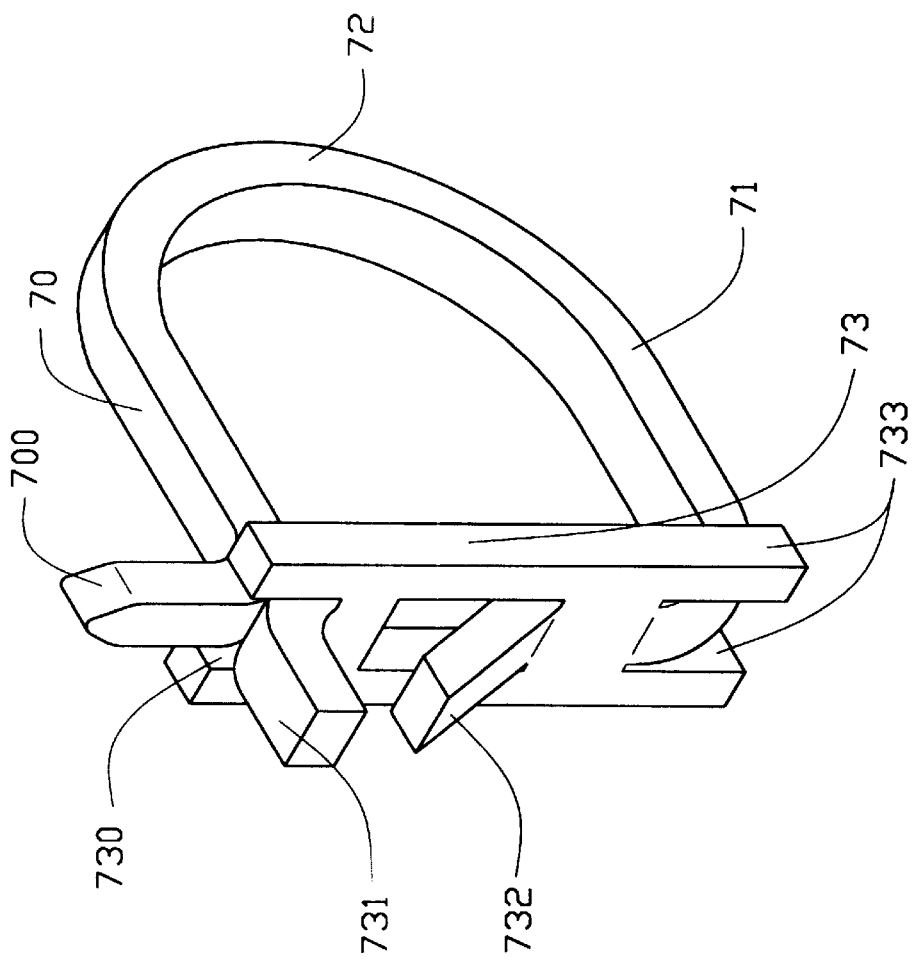
FIG. 7 is a perspective view of a terminal in accordance with a third embodiment of the present invention.

Referring to FIGS. 7 and 8, an LGA socket in accordance with a third embodiment of the present invention includes an insulative housing 8 defining a plurality of passageways 80 therethrough and a corresponding number of terminals 7 retained therein. The terminal 7 is basically similar to the terminal 4 of the second embodiment and has an upper spring arm 70 forming a curved end 700, a lower spring arm 71, a linking portion 72, and a securing arm 73 with a recess 730 defined therein and first and second projections 731, 732 formed thereon. A tine portion 733 is stamped from the securing arm 73 adjacent to the lower arm 71. A gap 92 is defined between the first projection 731 and a protrusion 800 projecting from an inner side of the passageway 80. Similarly, another gap 93 is defined between the second projection 732 and the protrusion 800. The two gaps 92, 93 provide the terminal 7 with an adjustable position, thus the terminal 7 can be moveable in the passageway 80 in a vertical direction. In addition, both sides of the securing arm 73, including the tine portion 733, are engaged with corresponding inner sides of the passageway 80 for retaining the terminal 7 therein.

Referring to FIG. 9, the LGA socket is mounted on a second circuit board. The tine portion 722 of the terminal 7 abuts against an electrical pad 91 of the second board. When the socket engages with a first circuit board, the curved end 700 abuts against an electrical pad 90 of the first board. The upper arm 70 of the terminal 7 is then deformed to contact the securing arm 73 thereby providing a short electrical path therethrough and reducing the overall height of the LGA socket. Such a short electrical path can effectively reduce self-inductance effects.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket for connecting a first circuit board and a second circuit board, comprising:
   an insulative housing defining a plurality of passageways therethrough; and
   a plurality of terminals retained in the passageways, each terminal including an upper spring arm, a lower spring arm, a linking portion for connecting the upper and lower arms, and a securing arm extending from the lower arm toward the upper arm for securing the terminal to the insulative housing; wherein
   when the socket engages with the first board, the upper spring arm of the terminal abuts against an electrical pad of the first board and is then deformed to contact the securing arm thereby providing a short electrical path therethrough; wherein
   a first projection and a second projection both extend from the securing arm for securing the terminal in the corresponding passageway.

2. The socket as claimed in claim 1, wherein a recess with a slanted edge is defined in an end of the securing arm for guiding a downward movement of the upper arm of the terminal.

3. The socket as claimed in claim 1, wherein the terminal is moveable in the passageway in a vertical direction.

4. The socket as claimed in claim 1, wherein a tine portion is formed on the securing arm adjacent to the lower arm.

5. A terminal used in an LGA socket mounted on a second circuit board for engaging with a first circuit board, the terminal comprising an upper spring arm, a lower spring arm, a linking portion connecting the upper and lower arms, and a securing arm extending from the lower arm toward the upper arm for being secured to an insulative housing of the socket,
   wherein when the socket engages with the first board, the upper spring arm of the terminal abuts against an electrical pad of the first board and is then deformed to contact the securing arm thereby providing a short electrical path therethrough;
   wherein said terminal further includes retaining means for engaging the terminal in a corresponding passageway of the LGA socket, said retaining means including a first projection and a second projection both extending from the securing arm, the first and second projections being adapted to secure the terminal in the passageway.

6. The terminal as claimed in claim 5, wherein the first projection is above the second projection.

7. A socket for connecting a first circuit board and a second circuit board, comprising:
   an insulative housing defining a plurality of passageways therethrough; and
   a plurality of terminals retained in the passageways, each terminal including an upper spring arm with a curved end projecting out of the corresponding passageway, a lower spring arm with a curved portion protruding out of the passageway opposite to the curved end of the upper spring arm, a linking portion for connecting the upper and lower arms, and a securing arm extending from the lower arm toward the upper arm for securing the terminal to the insulative housing; wherein
   when the socket engages with the first board and the second board, the upper spring arm of the terminal is deformably retracted to have the corresponding curved end guidably downward move along the securing arm and eventually embedded within the corresponding passageway, and the lower spring arm of the terminal is upwardly deflected to have the curved portion retract into the corresponding passageway; wherein
   a first projection and a second projection both extend from the securing arm for securing the terminal in the corresponding passageway.

* * * * *